(12) United States Patent
Reynoso et al.

(10) Patent No.: US 6,525,553 B1
(45) Date of Patent: Feb. 25, 2003

(54) GROUND PIN CONCEPT FOR SINGULATED BALL GRID ARRAY

(75) Inventors: Dexter Reynoso, Singapore (SG);
Rufino Ringor, Singapore (SG);
Fortunato V. Lopez, Singapore (SG)

(73) Assignee: St Assembly Test Services Ltd., Singapore (SG)

( * ) Notice: Subject to any disclaimer, the term of this patent is extended or adjusted under 35 U.S.C. 154(b) by 0 days.

(21) Appl. No.: 09/659,729

(22) Filed: Sep. 11, 2000

(51) Int. Cl.[7] .............................................. G01R 31/02
(52) U.S. Cl. ................................ 324/755; 324/158.1
(58) Field of Search ............................. 324/158.1, 755, 324/765, 754; 438/17

(56) References Cited

U.S. PATENT DOCUMENTS

| | | | |
|---|---|---|---|
| 5,604,161 A | 2/1997 | Barber | 437/216 |
| 5,672,965 A | * 9/1997 | Kurafuchi et al. | 327/158.1 |
| 5,811,980 A | 9/1998 | Doyle et al. | 324/758 |
| 5,877,552 A | 3/1999 | Chiang | 257/706 |
| 5,998,228 A | 12/1999 | Eldridge et al. | 438/15 |
| 6,194,786 B1 | * 2/2001 | Orcutt | 257/780 |
| 6,281,693 B1 | * 8/2001 | Fukuda | 324/757 |
| 6,288,346 B1 | * 9/2001 | Ojiri et al. | 324/756 |
| 6,313,651 B1 | * 11/2001 | Hembree et al. | 324/755 |
| 6,326,244 B1 | * 12/2001 | Brooks et al. | 438/124 |

* cited by examiner

Primary Examiner—Michael Sherry
Assistant Examiner—Jimmy Nguyen
(74) Attorney, Agent, or Firm—George O. Saile; Stephen B. Ackerman

(57) ABSTRACT

A new ground pin is provided for the testing of BGA devices. This ground pin can be provided in a area of the BGA package that does not interfere with critical regions of the surface of the BGA package. The method and apparatus of the invention are not limited to providing one ground pin but can be extended to use a multiplicity of ground pins.

5 Claims, 1 Drawing Sheet

GROUND PIN CONCEPT FOR SINGULATED BALL GRID ARRAY

BACKGROUND OF THE INVENTION (1) Field of the Invention

The invention relates to the fabrication of integrated circuit devices, and more particularly, to the design of a new ground pin that can be used in the singulated Ball Grid Array.

(2) Description of the Prior Art

Quad Flat Packages (QFP) have in the past been used to create surface mounted, high pin count integrated packages with various pin configurations. The electrical connections with these packages are typically established by closely spaced leads that are distributed along the four edges of the flat package. This limits the usefulness of the QFP since a high I/O count cannot be accommodated in this manner. To address this problem, the Ball Grid Array (BGA) package has been created whereby the I/O points for the package are distributed not only around the periphery of the package but over the complete bottom of the package. The BGA package can therefore support more I/O points making this a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

The development of the Ball Grid Array (BGA) devices has offered the opportunity to spread device I/O interconnect points over the entire surface of the device, this as opposed to having I/O connect points available only around the periphery of the IC device. Typically, the BGA package is surface mounted and mounted on the surface of a motherboard (a Printed Circuit Board or PCB). The concerns of making reliable I/O interconnects now have shifted from fine pitch in-line lines to contact balls. General sizes that are currently in use for Quad Flat Pack (QFP) packages are a footprint in the 25×25 mm range, a lead pitch of around 0.5 mm while the package itself is about 2 mm thick. A typical ball pitch for a BGA package is around 1.5 mm, with a footprint similar in size to the QFP package and a package thickness similar or slightly less than the thickness of a QFP package.

In order to test a BGA device, the contactor elements of the BGA device are inserted into a contactor plate having a plurality of sock. The contactor plate is coupled to a Device Under Test (DUT) loadboard, which is coupled to a testing machine. The DUT loadboard is in essence printed circuit board that completes electrical connections between the BGA contactor elements via the contactor plate and the tester In order to test the BGA device, the tester sends signals to and receives signal from the BGA device via the electrical conductor paths provided by the contactor plate and the DUT board.

In assembling a BGA package to a PCB, the lower surface of the PC is typically provided with contact balls that connect to an interfacin network of conducting lines that connect to surrounding electrical components or systems. A typical PCB contains two layers of interconnet metal. A cavity is typically formed in the upper surface of the PCB, to semiconductor device that is to be mounted on the PCB is inserted into this cavity. The contact balls of the BGA make electrical contact with the layers of interconnect metal in the PCB, the BGA die is further with bonded to the PCB and enclosed in a molded casing. The operation of with bonding limits the size of the surface on which the wire is connected which in turn increases the size of the die that can be used. The side the BGA that faces the PCB in this arrangement is the backside of the die, heat exchange between the BGA die and the underlying PCB takes place through this interface of the BGA die with the PCB. Since signal lines (in the PCB) are typically of fine construction, these lines do not leave themselves to provide a good path for heat exchange. The heat exchange between the BGA and the PCB must therefore depend on (wider or larger cross section) ground planes in the PCB, which brings with it a limitation on the space that is available to route signal lines in the PCB.

At present the final testing of semiconductor Integrated Circuits performed using Integrated Circuit Handler apparatus whereby each of the IC packages is handled as an individual unit and is advanced to the te socket of the DUT by either gravity feed or by using pick and place methods.

Mass production of semiconductor Integrated Circuits (IC's) bring with it the requirement that these IC's can be tested at high speed. Current trends in the semiconductor industry also promote convenient a bulk handling of semiconductor chips. While high speed testing has bee current practice in the industry for a number of years, this testing i most cases handles individual chips. By mounting individual chips onto strips the flow of chips through the manufacturing and testing cycles be greatly facilitated. This improved capability of handling a larger number of chips has to be accompanied with corresponding improvements the testing capabilities for these chips. Moreover, strip testing also eliminates the use of trays for transportation and storage of individu chips throughout the whole testing process. This results in requiremen for improved capabilities of handling chips that are mounted on strips a testing environment. These improved capabilities transport chips at rapid rate in and out of the test position. While in the test position the chips must be contacted in a rapid and dependable way so that the chip can be tested. This contacting of the chip while the chip is in t position where it can be tested is done by means of probe sockets. The probe sockets are required to rapidly and dependably contact the semiconductor devices under test for the purpose of testing these devices.

During testing of the BGA device, it is important that proper gro connection is provided between the device under test and the test equipment. The ground pin that is provided for this purpose in the present test configuration has a relatively small surface area and is therefore prone to make poor electrical contact between the BGA device and the test equipment. One of the assembly aspects of mounting a BGA device on a PCB is to test the quality of connection that is made in w bonding the BGA device to the PCB. This connection must be a low resistivity connection, which means that the detection of non-stick conditions, whereby the wire bond connection is a high resistivity connection, is required. The relatively small area of the present grou pin presents a relatively too high resistance, which makes the detecti of the non-stick condition difficult and unreliable. The ground pin of the invention addresses this problem by providing a ground pin that allows for good, low resistivity contact between the BGA device and te equipment. The quality of the wire bonding process can therefore be readily monitored.

U.S. Pat. No. 5,604,161 (Barber) shows a semiconductor device assembly with minimized bond finger connections.

U.S. Pat. No. 5,998,228 (Eldridge et al.) shows a method of testing a singulated chip that uses a ground.

U.S. Pat. No. 5,877,552 (Chaing et al.) shows ground pins on a package.

U.S. Pat. No. 5,811,980 (Doyle et al.) teaches a ground pin on a package that contacted by a spring probe/pin. However, this reference differs from invention.

SUMMARY OF THE INVENTION

A principle objective of the invention is to provide a dependable method of grounding a BGA device during testing of that device.

In accordance with the objectives of the invention a new ground pin is provided for the testing of BGA devices.

DESCRIPTION OF THE PREFERRED EMBODIMENTS

In the typical process of creating semiconductor devices, multiple devices are created over the surface of a substrate. The created devices must be tested in order the select the functional and non-functional devices that have been created over the substrate. This testing uses a wafer tester whereby the tester makes a plurality of pressure point contacts with to an equal plurality of connection points or bond pads that are for this purpose provided over the surface of the individual semiconductor dies. In this manner, a semiconductor die can be functionally tested or the die can be subjected to a process of burn-in that is used to further condition the functionality of the die. The wafer tester uses probes that are connected to a probe card, a plurality of probe elements are connected to the probe card. The tips of the probes make pressure contact with the test points on the surface of the semiconductor die.

Wire bond pads are used to connect the semiconductor die to externally located and surrounding electronic circuitry and components. A wire is for this purpose connected to the wire bond pad whereby this wire leads to the indicated surrounding electronic circuitry and components. It is clear that the connection that is make between the bond pad and the bonded wire that is connected to the bond pad must be a low-resistivity connection in order to avoid negatively affecting circuit performance due to this connection. The path that leads from the test probe through the to be tested bond pad through the support package on which the BGA device is mounted to the tester that performs the subject test (of the quality/resistivity of the interface between the bonded wire and the bond pad) must therefore be a low resistance path. This implies that the resistance that is encountered between the support package for the BGA device and the ground of the test equipment that is used to perform the bond pad connection resistance test must be as low as possible. The invention is therefore limited to providing a ground land for singulated BGA packages and does not address any of the numerous aspects of BGA device or packaged device testing such as probe design and the therewith connected spring contact elements or structures, test boards, interconnection elements, probe tip structure, probe cards and the like.

Figure 1:
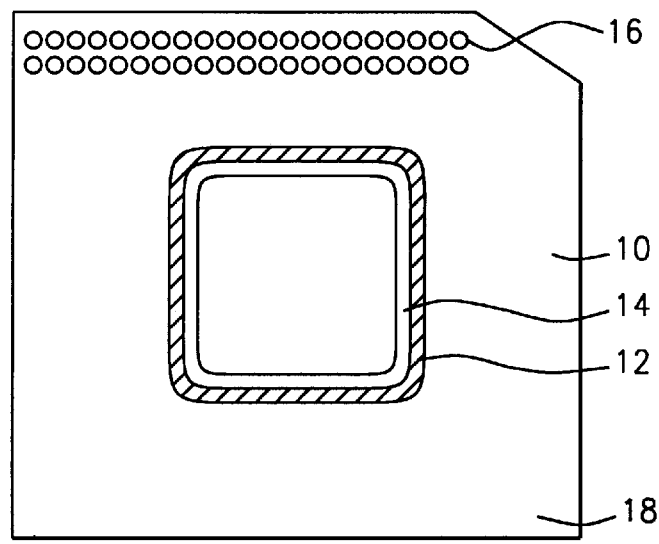
FIG. 1 shows a top view of mounting a singulated BGA device in a BGA supporting package.

Referring now specifically to FIG. 1, there is shown a top view of a BGA assembly 10. The solder ball connections 16 are the points of interface between the BGA package 10 and the surrounding circuitry and components to which the BGA device is connected. The BGA device (not shown in FIG. 1) is inserted into cavity 14 and connected, via wire bond connections, to the network of interconnect metal lines that is provided in several layers that form the package 10. These interconnect metal lines (not shown in FIG. 1) connect the wire bonded BGA device to the solder ball points of contact 16 from where the BGA device is integrated into the surrounding electronic circuitry. The objective of the test that is subject of the invention is, as previously stated, to test the resistivity of the wire bond connections. To make this test a meaningful and sensitive test, the potential resistivity that is present in the wire bond connection (to the wire bond pad) must be identifiable as being large with respect to all other resistivity that is encountered in the test path that leads from the test probe to the tester. The resistivity that is therefore present in the interface between the package 10 and the tester must be as low as possible. For previous testing of the bonded wire to bond pad interconnect, a ground pin has been provided in the BGA package. For small BGA packages however the area of contact between the ground pin and the underlying surface is very small, resulting in a relatively high resistance of this contact area. This high resistivity disables the evaluation of the non-sticking (poor or high resistivity contact between the bonded wire and the bond pad) condition during the wire bond process. The conventional ground pin must therefore be replaced with a contact that has low contact resistivity, the invention provides such a contact.

The wire bond operation typically starts with the die being inserted (in, for instance, a cavity that is provided for this purpose in the BGA package), a bond wire is connected to the die, the other end of the bond wire is connected to the substrate lead, the test system applies a current between the bond wire and the (connected) die in order to validate the connection that has been made to the die. If the tester finds a good (low resistivity) connection, the wire bonding operation continues to the next bond connection that must be provided to the BGA die. If the tester finds a bad connection, that is high resistivity or an open connection, the sequence of providing wire bond connections is stopped and an operator intervenes.

The test system that is used to perform the above indicated sequence of bond wire validations needs a good, low resistivity ground connection in order to effectively perform these tests. Without such a ground connection, the validity of all the tests that are performed is questionable. The invention addresses this problem by providing a solid and low resistivity ground connection.

Figure 2:
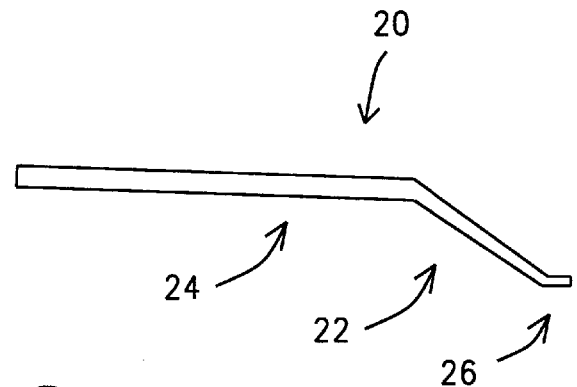
FIG. 2 shows a side view of the ground pin of the invention.

Referring now specifically to FIG. 2, there is shown a side view of the ground pin 20 of the invention. It must be noted that the profile of the ground pin shows a sharp slant or bend such that the extension 22 of the body 24 of the ground pin 20 makes a sharp angle with the body 24 of the ground pin. This sharp bend allows for the contact point 26 of the ground pin 20 to make contact with the grounding surface, which is for this purpose provided on a surface of the wire bond machine, under pressure thereby pressing the contact point 26 firmly against the grounding surface of the wire bond machine. The result of this pressure is that a low-resistivity contact is established between the BGA device and the ground land of the device tester, thereby eliminating any effect of a potential high resistivity contact that would disable dependable detection of poor quality wire bond connections.

As shown in FIG. 1, a ground ring 12 is provided around the periphery of the cavity 14 into which the die is inserted.

This ring 12 is, in typical applications, surrounded by one or more concentric rings (not shown in FIG. 1) for further interconnect of the BGA device. The ground ring 12 forms the reference ground for the test system, this ground must therefore be a low resistivity ground between the tester and the surrounding components. The ground ring 12 can, for purposes of grounding the test system and for providing low resistivity paths between the tester, the BGA die ground connection and the package on which the BGA die is mounted, be connected with a ground area location where the ground extension does not materially interfere with the mounting of other components that make part of the BGA package. As an example of such a location, the corner 18 of the device package 10 has been indicated but the method and apparatus of the invention are not limited to this location. In order to assure the low resistivity of this ground area 18 with the underlying surfaces, the method of the invention has provided a ground spring that is shown in FIGS. 2 and 3.

Figure 3:
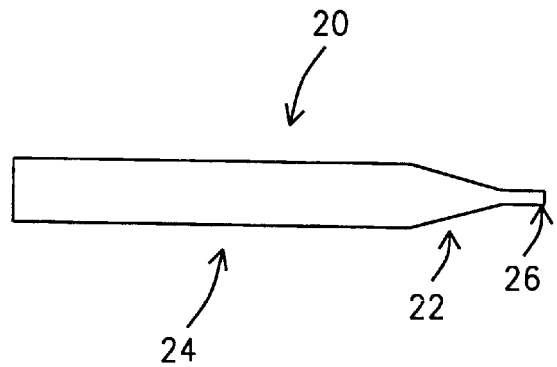
FIG. 3 shows a top view of the ground pin of the invention.

The ground pin 20 that is shown in FIGS. 2 and 3 aligns with a ground area that is provided in the surface of the package 10. The ground pin is further interconnected with the ground area with which it is aligned. Traces or interconnect patterns can be used to interconnect the ground ring 12 with the ground areas that can be provided in the region 18 or any other suitable surface of the package 10. The ground traces can further contain Au and Ni coated solder pads and the (typically copper) traces that lead to the ground area 18 (FIG. 1).

It is clear that the ground spring 20 that is shown in FIGS. 2 and 3 and that is connected to an overlying ground region can provide a low resistivity path between the ground region and underlying surfaces. The method and apparatus of the invention therefore provide a low resistivity path and a common ground between the tester that is used to validate wire bond connections (for low resistivity interconnects to the die and the ground ring 12), the ground ring 12 of the BGA package and underlying surfaces of the package.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An apparatus for testing singulated Ball Grid Array devices that have been mounted in a BGA supporting package, comprising at least one Leaf Spring Ground Pin as part of said BGA supporting package, said at least one Leaf Spring Ground Pin having a body and an extension thereof, said at least one Leaf Spring Ground Pin comprising:

a low resistivity path of interconnect with an overlying region of a grounded interface;

an exposed surface providing easy contact between said BGA supporting package and a ground plane of a tester used for said testing;

being provided in a non-functional surface area of said BGA supporting package;

being provided in a location not varying with different BGA supporting package designs, said location being determined with respect to said tester thereby making application of said at least one Leaf Ground Pin independent of BGA supporting package design;

being provided with a sharp bend, an extension of said at least one Leaf Spring Ground Pin being in a plane intercepting a plane of a body of said at least one Leaf Spring Ground Pin under an angle;

being provided with a contact point as part of said extension of said at least one Leaf Spring Ground Pin, said contact point making contact with a grounding surface;

being provided for making contact with a grounding surface under pressure by pressing said contact point firmly against a grounding surface, providing a low-resistivity contact between a BGA device and a ground land of a BGA device tester; and contains gold thereby providing a low-resistivity path between said BGA supporting package and said tester.

2. A method for testing a singulated Ball Grid Array device, comprising:

providing a tester, said tester being provided with BGA device testing capabilities thereby including ability to test for resistivity of wire bond to bond pad interface;

providing a BGA supporting package, said BGA supporting package comprising at least one Leaf Spring Ground Pin, said at least one Leaf Spring Ground Pin having a body and an extension thereof.

3. The method of claim 2 wherein said at least one Leaf Spring Ground Pin of said BGA supporting package comprising:

an exposed surface, providing easy contact between said BGA supporting package and a tester used for said testing;

a low resistivity path of interconnect with an overlying region of a grounded interface;

being provided in a non-functional surface area of said BGA supporting package;

being provided in a location not varying with different BGA supporting package designs, said location being determined with respect to said tester thereby making application of said at least one Leaf Spring Ground Pin independent of BGA supporting package design;

being provided with a sharp bend, an extension of said at least one Leaf Spring Ground Pin being in a plane intercepting a plane of a body of said at least one Leaf Spring Ground Pin under an angle;

being provided with a contact point as part of said extension of said at least one Leaf Spring Ground Pin, said contact point making contact with a grounding surface;

being provided for making contact with a grounding surface under pressure by pressing said contact point firmly against a grounding surface, providing a low-resistivity contact between a BGA device and a ground land of a BGA device tester; and comprising gold, providing a low-resistivity path between said BGA supporting package and said tester.

4. A method for testing a singulated Ball Grid Array device, comprising:

providing a tester, said tester being provided with BGA device testing capabilities, including ability to test for resistivity of wire bond to bond pad interface;

providing a BGA supporting package, said BGA supporting package comprising at least one Leaf Spring Ground Pin.

5. The method of claim 4 wherein said each of said at least one Leaf Spring Ground Pin of said BGA supporting package comprising:

an exposed surface allowing easy contact between said BGA supporting package and a tester used for said testing;

a low resistivity path of interconnect with an overlying region of a grounded interface;

being provided in a non-functional surface area of said BGA supporting package;

being provided in a location not varying with different BGA supporting package designs, said location being determined with respect to said tester thereby making application of said at least one Leaf Spring Ground Pin independent of BGA supporting package design;

being provided with a sharp, an extension of said at least one Leaf Spring Ground Pin being in a plane intercepting a plane of a body of said at least one Leaf Spring Ground Pin under an angle;

being provided with a contact point as part of said extension of said at least one Leaf Spring Ground Pin, said contact point making contact with a grounding surface;

being provided for making contact with a grounding surface under pressure by pressing said contact point firmly against a grounding surface, providing a low-resistivity contact between a BGA device and a ground land of a BGA device tester; and comprising gold, providing a low-resistivity path between said BGA supporting package and said tester.

* * * * *

UNITED STATES PATENT AND TRADEMARK OFFICE
CERTIFICATE OF CORRECTION

PATENT NO. : 6,525,553 B1
DATED : February 25, 2003
INVENTOR(S) : Reynoso et al.

It is certified that error appears in the above-identified patent and that said Letters Patent is hereby corrected as shown below:

Column 1,
Line 49, delete "sock." and insert therefor -- socket. --
Line 51, after "essence", insert therefor -- a --
Line 54, delete "tester", insert therefor -- tester. --
Line 55, delete "signal" and insert therefor -- signals --
Line 59, delete "PC" and insert therefor -- PCB --
Line 60, delete "interfacin" and insert therefor -- interfacing --
Line 64, delete "to", and insert therefor -- the --
Line 68, delete "with", and insert therefor -- wire --

Column 2,
Line 1, delete "with", and insert therefor -- wire --
Line 5, delete "die", and insert therefor -- IC die --
Line 9, delete "leave" and insert therefor -- lend --
Line 18, delete "te" and insert therefor -- test --
Line 21, delete "bring" and insert therefor -- brings --
Line 23, delete "a" and insert therefor -- and --
Line 24, delete "bee" and insert therefor -- been --
Line 25, delete "i" and insert therefor -- in --
Line 33, delete "individu" and insert therefor -- individual --
Line 34, delete "requiremen" and insert therefor -- requirement --
Line 37, delete the 2nd occurrence of "position" and insert therefore -- position, --
Line 40, delete "t" and insert therefor --the--
Line 45, delete "gro" and insert therefor -- ground --
Line 53, delete "w" and insert therefor -- wire --
Line 56, delete "grou" and insert therefor -- ground --
Line 58, delete "detecti" and insert therefor -- detection --
Line 61, delete "te" and insert therefor -- test --

Column 3,
Line 4, after "that", insert therefor -- is --
Line 5, after "from", insert therefor -- the --

UNITED STATES PATENT AND TRADEMARK OFFICE
CERTIFICATE OF CORRECTION

PATENT NO.   : 6,525,553 B1
DATED        : February 25, 2003
INVENTOR(S)  : Reynoso et al.

It is certified that error appears in the above-identified patent and that said Letters Patent is hereby corrected as shown below:

Column 5,
Line 10, after "area", insert therefore -- that may be located on the surface of the package 10 in a --

Signed and Sealed this

Twenty-sixth Day of July, 2005

JON W. DUDAS
*Director of the United States Patent and Trademark Office*